United States Patent
Choi et al.

(10) Patent No.: US 8,492,223 B2
(45) Date of Patent: Jul. 23, 2013

(54) METHODS OF MANUFACTURING FLASH MEMORY DEVICES BY SELECTIVE REMOVAL OF NITROGEN ATOMS

(75) Inventors: Jong-wan Choi, Suwon-si (KR);
Wan-sik Hwang, Hwaseong-si (KR);
Gil-heyun Choi, Gangnam-gu (KR);
Eunkee Hong, Seongnam-si (KR);
Ju-seon Goo, Suwon-si (KR); Bo-young Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 167 days.

(21) Appl. No.: 13/085,631

(22) Filed: Apr. 13, 2011

(65) Prior Publication Data

US 2011/0256708 A1  Oct. 20, 2011

(30) Foreign Application Priority Data

Apr. 14, 2010 (KR) .................. 10-2010-0034389

(51) Int. Cl.
*H01L 21/321* (2006.01)
(52) U.S. Cl.
USPC ................................... 438/257; 257/E21.159
(58) Field of Classification Search
USPC .......... 438/257–267, 593, 684; 257/E21.159, 257/E21.209
See application file for complete search history.

(56) References Cited

U.S. PATENT DOCUMENTS

| | | | |
|---|---|---|---|
| 2008/0203481 A1* | 8/2008 | Akahori et al. | 257/365 |
| 2009/0280615 A1* | 11/2009 | Lee et al. | 438/306 |
| 2011/0312155 A1* | 12/2011 | Iikawa et al. | 438/435 |

FOREIGN PATENT DOCUMENTS

| | | |
|---|---|---|
| JP | 09-251998 | 9/1997 |
| KR | 1020040046511 A | 6/2004 |
| KR | 1020070058725 A | 6/2007 |

* cited by examiner

*Primary Examiner* — Savitr Mulpuri
(74) *Attorney, Agent, or Firm* — Myers Bigel Sibley & Sajovec

(57) ABSTRACT

A method of manufacturing a flash memory device includes: forming a dielectric layer on an active region of a substrate having an isolation region and the active region; forming a floating gate on the dielectric layer; forming an isolation layer in the isolation region; forming a nitride layer including a first nitride layer portion formed on an exposed surface of the floating gate and a second nitride layer portion formed on an exposed surface of the isolation layer; selectively removing nitrogen atoms from the second nitride layer portion of the nitride layer; forming an inter-gate dielectric layer on both the first nitride layer portion and the isolation layer; and forming a control gate on the inter-gate dielectric layer.

11 Claims, 16 Drawing Sheets

METHODS OF MANUFACTURING FLASH MEMORY DEVICES BY SELECTIVE REMOVAL OF NITROGEN ATOMS

CROSS-REFERENCE TO RELATED APPLICATION

This application claims priority under 35 U.S.C. §119 from Korean Patent Application No. 10-2010-0034389, filed on Apr. 14, 2010 in the Korean Intellectual Property Office, the disclosure of which is incorporated herein in its entirety by reference.

BACKGROUND

The inventive concept relates to methods of manufacturing semiconductor devices, and more particularly, to methods of manufacturing flash memory devices.

Flash memory devices are electrically erasable programmable read-only memories (EEPROM) that electrically control the input/output of data therefrom by Fowler-Nordheim (F-N) tunneling or channel hot electron injection. Various manufacturing processes for improving the electrical reliability of the flash memory devices have been proposed.

SUMMARY

The inventive concept provides methods of manufacturing flash memory devices having improved electrical reliability and cell data capabilities, and that also suppress charge loss and exhibit reduced leakage currents.

According to an aspect of the inventive concept, methods of manufacturing flash memory devices are provided that include: forming a dielectric layer on an active region of a substrate; forming a floating gate on the dielectric layer; forming an isolation layer in an isolation region of the substrate; forming a nitride layer including a first nitride layer portion that is formed on an exposed surface of the floating gate and a second nitride layer portion that is formed on an exposed surface of the isolation layer; selectively removing nitrogen atoms from the second nitride layer portion of the nitride layer; forming an inter-gate dielectric layer on both the first nitride layer portion and the isolation layer; and forming a control gate on the inter-gate dielectric layer.

In some embodiments, the nitride layer may be formed by substantially simultaneously exposing an exposed surface of the floating gate and an exposed surface of the isolation layer to a nitridation atmosphere.

The floating gate may comprise a doped polysilicon floating gate and the isolation layer may comprise an oxide, and selectively removing nitrogen atoms from the second nitride layer portion of the nitride layer may comprise substantially removing the nitrogen atoms from the second nitride layer portion while substantially leaving the nitrogen atoms in the first nitride layer portion.

In other embodiments, selectively removing nitrogen atoms from the second nitride layer portion of the nitride layer may include performing a wet process on the nitride layer in order to selectively remove the nitrogen atoms from the second nitride layer portion of the nitride layer. The wet process may include exposing the nitride layer to deionized water maintained at a temperature of from about 40° C. to about 100° C. The wet process may include exposing the nitride layer to a mixed solution of deionized water and at least one selected from the group consisting of ammonia and peroxide. In some embodiments, selectively removing the nitrogen atoms from the second nitride layer portion of the nitride layer may further include performing a thermal treatment process on the nitride layer before performing the wet process on the nitride layer. The thermal treatment process is performed at a temperature of from about 150° C. to about 600° C. The thermal treatment process may be performed under an atmosphere of any one selected from the group consisting of an inactive gas, an $O_2$ gas, an $H_2$ gas, and an $N_2$ gas, or a combination of the foregoing.

In still further embodiments, selectively removing nitrogen atoms from the second nitride layer portion of the nitride layer may comprise performing a dry process on the nitride layer in order to selectively remove the nitrogen atoms from the second nitride layer portion of the nitride layer. The dry process may be performed using an oxygen radical. The dry process may involve applying $H_2$ and $O_2$ to the insulating layer at a temperature of from about 800° C. to about 900° C. and at a pressure of from about 5 to about 100 Torr.

According to another aspect of the inventive concept, methods of manufacturing flash memory devices are provided that include: forming dielectric layer on an active region of a substrate; forming a floating gate including a polysilicon on the dielectric layer; forming an isolation layer that includes an oxide in an isolation region of the substrate; forming a nitride layer including a first nitride layer portion that is formed on an exposed surface of the floating gate and a second nitride layer portion that is formed on an exposed surface of the isolation layer; and selectively removing nitrogen atoms from the second nitride layer portion of the nitride layer.

According to another aspect of the inventive concept, methods of manufacturing flash memory devices are provided that include: forming an electrode pattern including a polysilicon on a substrate; forming an oxide layer around the electrode pattern; forming a nitride layer including a first nitride layer portion that is formed on an exposed surface of the electrode pattern and a second nitride layer portion that is formed on an exposed surface of the oxide layer, by exposing the substrate to a nitridation atmosphere; performing a thermal treatment process on the nitride layer; and selectively removing nitrogen atoms from the second nitride layer portion.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
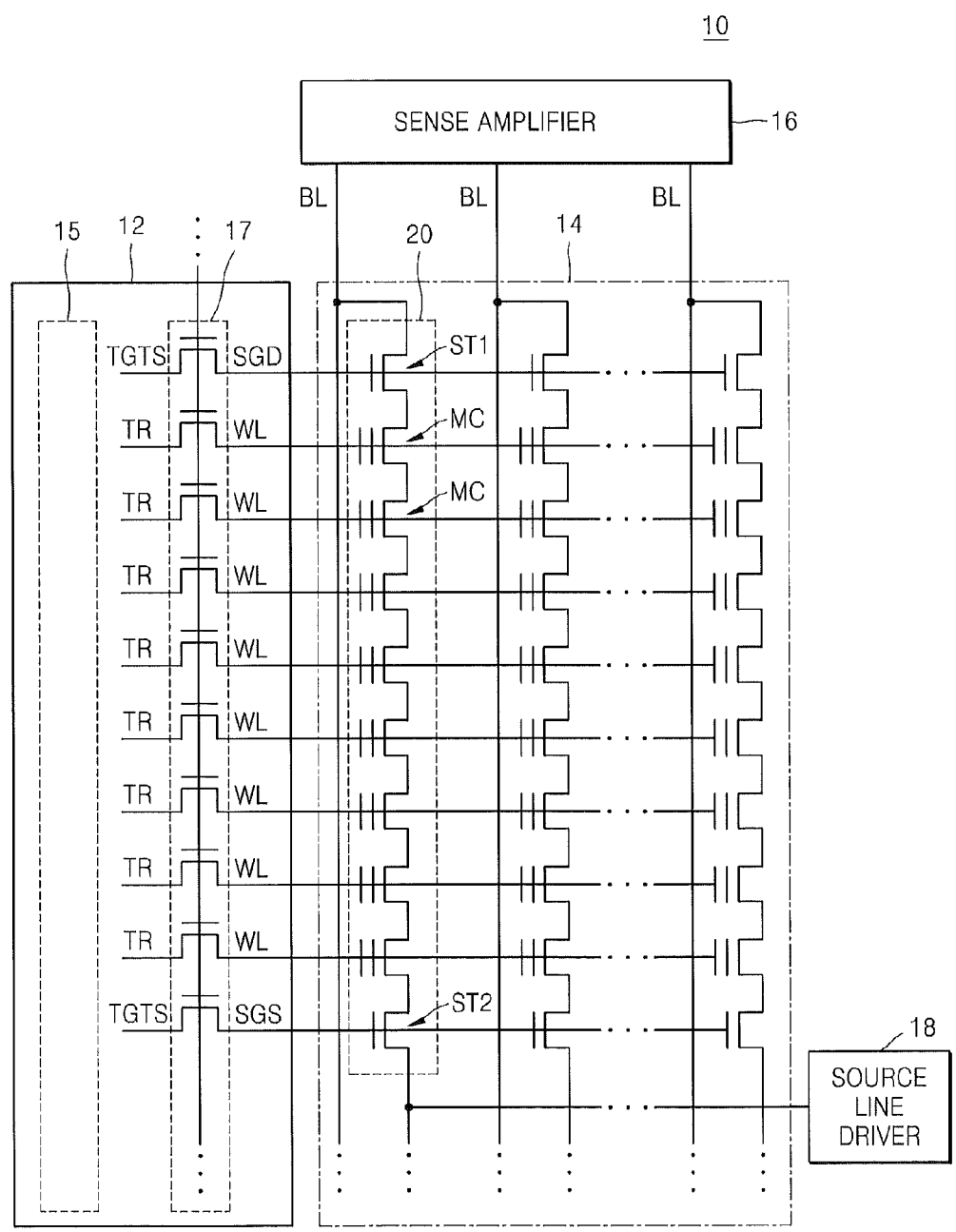
FIG. 1 is a circuit diagram illustrating a flash memory device according to an embodiment of the inventive concept.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art. Like reference numerals in the drawings denote like elements, and thus their description will be omitted. Furthermore, in the drawings, various elements and regions may be roughly illustrated. Accordingly, the present invention is not limited by relative sizes or intervals illustrated in the accompanying drawings.

FIG. 1 is a circuit diagram illustrating a NAND flash memory device 10 according to embodiments of the inventive concept.

Referring to FIG. 1, the flash memory device 10 includes a row decoder 12, a memory cell array 14, a sense amplifier 16, and a source line driver 18.

The memory cell array 14 of the NAND flash memory device 10 may include a plurality of memory cell strings 20 that are connected to respective ones of a plurality of bit lines BL. The memory cell strings 20 may each include a plurality of memory cells MC and selection transistors ST1 and ST2. The memory cells MC may store data. A plurality of word lines WL may be combined with the memory cells MC of each of the cell strings 20 so as to control the memory cells MC. The number of memory cells MC may be selected based on the capacity of the flash memory device 10.

The row decoder 12 may include the plurality of word lines WL, selection gate lines SGD and SGS, and peripheral decoder circuits 15 and 17. The sense amplifier 16 reads and amplifies data that is stored in a selected memory cell MC. The source line driver 18 supplies power to a source line of each of the memory cell strings 20.

Figure 2:
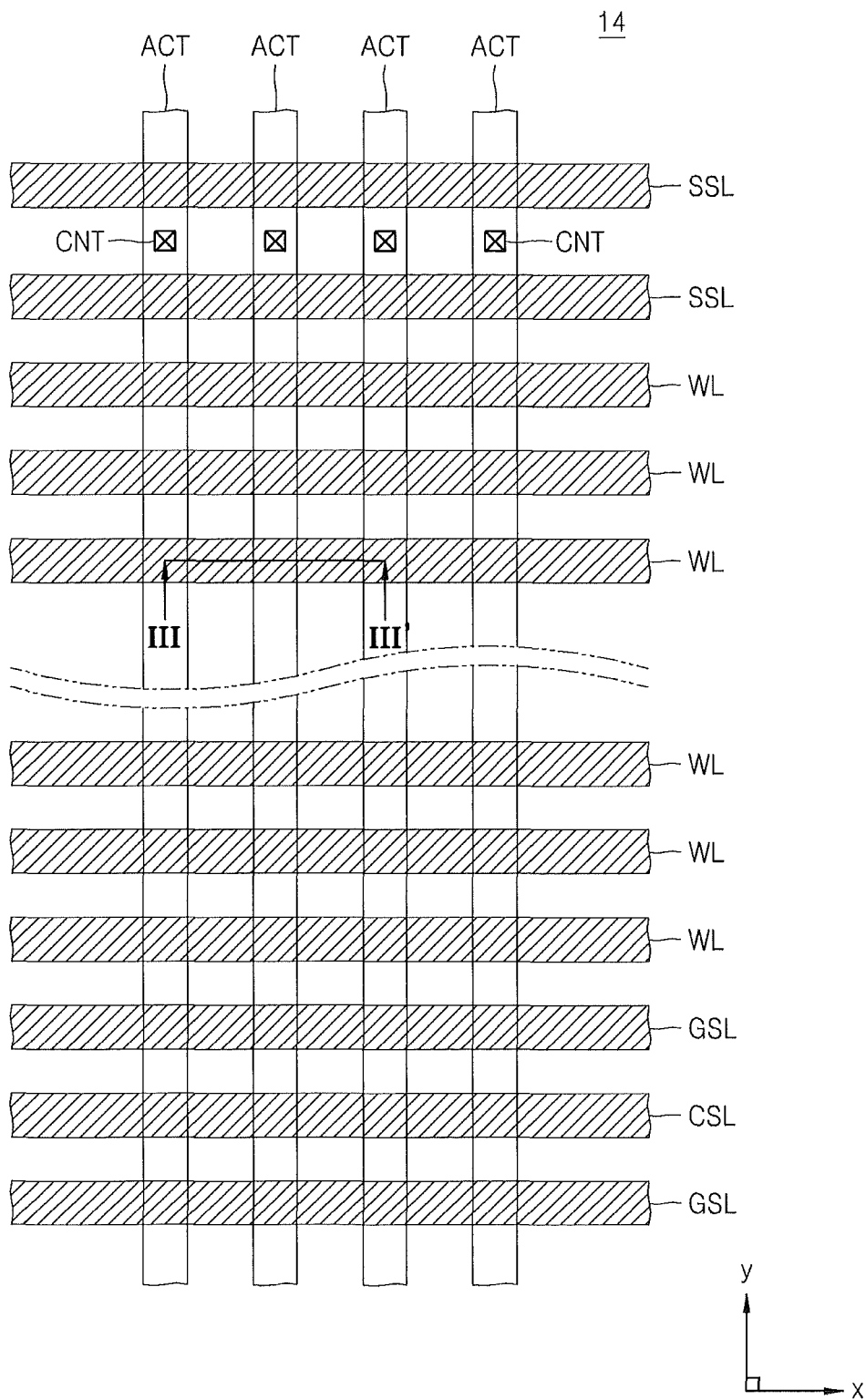
FIG. 2 illustrates a layout of a memory cell array of FIG. 1.

FIG. 2 illustrates a layout of the memory cell array 14 of FIG. 1, according to an embodiment of the inventive concept.

Referring to FIG. 2, the memory cell array 14 may include a plurality of active regions ACT that are arranged in parallel in a first direction, i.e., in a y direction. A string selection line SSL, a ground selection line GSL, and the plurality of word lines WL, which form the selection transistors ST1 and ST2, may extend so as to cross the active regions ACT, that is, in an x direction.

Impurity regions constituting a source and a drain may be disposed in the active regions ACT that are respectively disposed at both sides of the string selection line SSL, the plurality of word lines WL, and the ground selection line GSL. The word line WL and one of the impurity regions, which are disposed in the active regions ACT respectively disposed at both sides of the word line WL, may constitute a cell transistor. A contact CNT for connection between the active region ACT and the bit line BL (see FIG. 1) may be disposed between the two adjacent string selection lines SSL. The active region ACT and the bit line BL may be connected to each other via the contact CNT. In addition, a common source line CSL may be disposed between the two adjacent ground selection lines GSL.

Each of the plurality of word lines WL may include a tunnel insulating layer, a floating gate, an inter-gate dielectric layer, and a control gate that are sequentially stacked on the active regions ACT.

FIGS. 3A through 3J are cross-sectional views illustrating a process of manufacturing the flash memory device 10 of FIG. 1, according to an embodiment of the inventive concept. The cross-sections illustrated in FIGS. 3A through 3J may correspond to a line III-III' of FIG. 2.

Figure 3A:
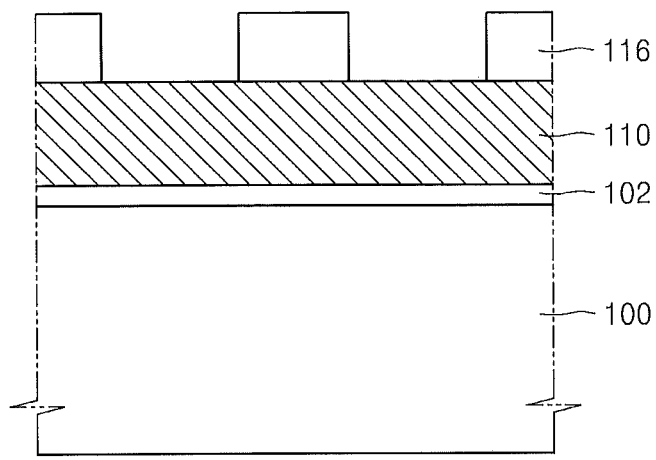
FIGS. 3A through 3J are cross-sectional views illustrating a process for manufacturing the flash memory device of FIGS. 1 and 2.

Referring to FIG. 3A, a dielectric layer 102 and then a floating gate electrode layer 110 are sequentially formed on a substrate 100. A plurality of hard mask patterns 116 that expose portions of the floating gate electrode layer 110 are formed on the floating gate electrode layer 110.

The substrate 100 may be a semiconductor substrate such as a silicon wafer, a silicon-on-insulator (SOI) substrate, a semiconductor epitaxial layer, etc.

The dielectric layer 102 may be a thermal oxidation layer. The dielectric layer 102 may have a thickness in the range of about 50 to about 100 Angstroms, but is not limited thereto. The dielectric layer 102 may be formed by radical oxidation, and may be patterned to form a plurality of tunnel dielectric layers 102A (see FIG. 3B) of a cell transistor.

The floating gate electrode layer 110 may be formed of a doped polysilicon, and may be formed by chemical vapor deposition (CVD). The floating gate electrode layer 110 may have a thickness in the range of about 500 to about 1500 Angstroms, but is not limited thereto.

The hard mask pattern 116 may be formed of a material having an etch selectivity with respect to the floating gate electrode layer 110, and may be configured as a single-layer or a plurality of layers in which a plurality of materials are sequentially stacked. The hard mask pattern 116 may be formed of, for example, one selected from the group consisting of an oxide layer and a nitride layer, or a combination thereof.

Figure 3B:
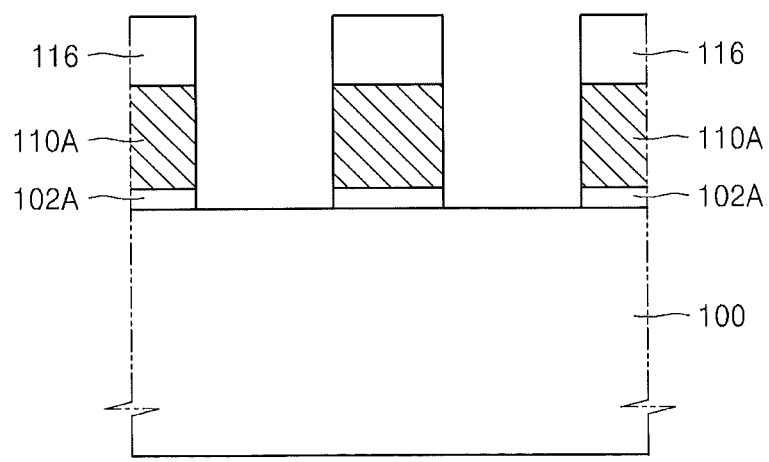

Referring to FIG. 3B, the plurality of tunnel dielectric layers 102A and a plurality of floating gates 110A may be formed by etching the floating gate electrode layer 110 and the dielectric layer 102 using the hard mask pattern 116 as an etching mask, until the substrate 100 is exposed.

Figure 3C:
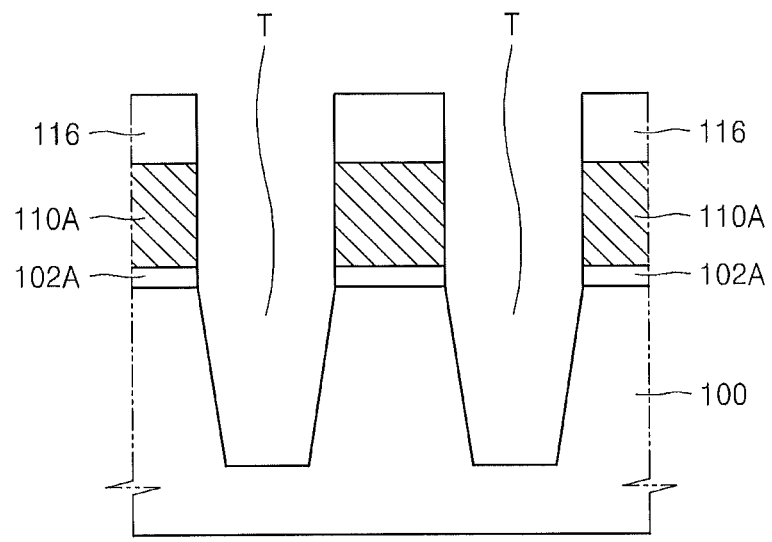

Referring to FIG. 3C, a plurality of trenches T are formed in isolation regions of the substrate 100 by etching exposed portions of the substrate 100 using the stacked structure of the tunnel dielectric layers 102A, the floating gates 110A, and the hard mask patterns 116 as an etching mask.

Figure 3D:
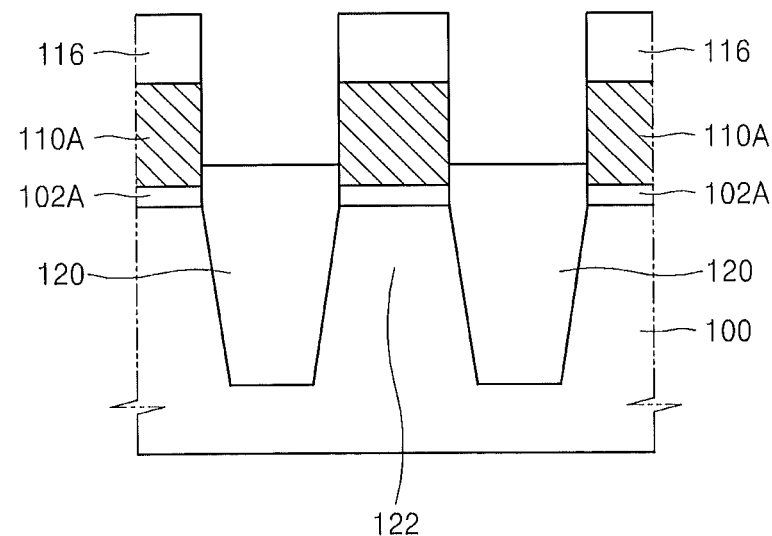

Referring to FIG. 3D, a plurality of isolation layers 120 are formed by depositing an insulating material in the trenches T.

A plurality of active regions 122 may be defined in the substrate 100 by the isolation layers 120. The active regions 122 may correspond to the active regions ACT of FIG. 2.

The isolation layers 120 may be formed by depositing an insulating layer, which has a thickness that is sufficient to completely fill the trench T in the substrate 100, inside the trench T and on the stacked structure of the tunnel dielectric layers 102A, the floating gates 110A, and the hard mask patterns 116, and then performing an etch-back process on the insulating layer so that the isolation layer 120 remains. The insulating layer may comprise an oxide layer. For example, the insulating layer may be formed of one selected from the group consisting of a high temperature oxide (HTO), a medium temperature oxide (MTO), a plasma enhanced tetra-ethyl othosilicate (PE-TEOS), a spin on glass (SOG), an undoped silicate glass (USG), a high density plasma (HDP) CVD oxide, and a tonen silazene (TOSZ), or a combination of the foregoing.

The isolation layer 120 may completely cover a sidewall of the tunnel dielectric layer 102A.

Figure 3E:
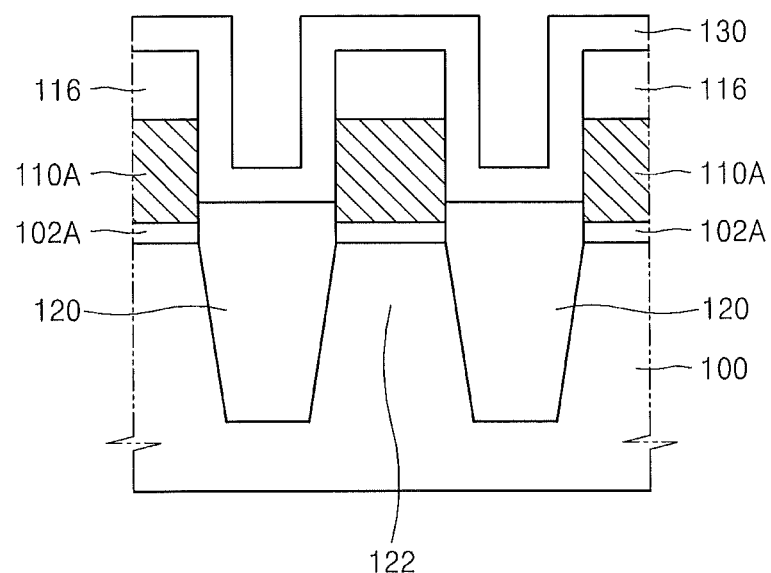

Referring to FIG. 3E, a spacer layer 130 is formed to cover the stacked structure of the floating gate 110A and the hard mask pattern 116 and to also cover the isolation layer 120.

The spacer layer 130 may be, for example, a silicon oxide layer that is formed by CVD.

Figure 3F:
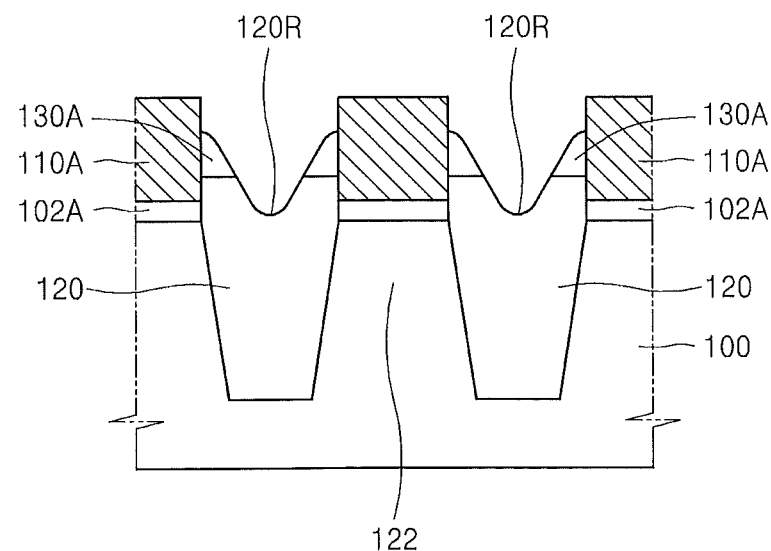

Referring to FIG. 3F, insulating spacers 130A may be formed on sidewalls of the floating gate 110A by performing an etch-back process on the spacer layer 130. During this etch-back process, a portion of the isolation layer 120 that is exposed between two adjacent insulating spacers 130A may be etched, thereby forming a recess region 120R in the center of an upper surface of the isolation layer 120. In the recess region 120R, a distance between the upper surface of the isolation layer 120 and an edge portion of the active region 122 may be maintained at more than a predetermined value, so as to minimize an electrical interference between a control gate (160 of FIG. 3J) that is formed on the isolation layer 120 and the active region 122 in a subsequent process.

After the etch-back process is performed on the spacer layer 130 to form the insulating spacer 130A, the hard mask pattern 116 that remains on the floating gate 110A may be removed.

Figure 3G:
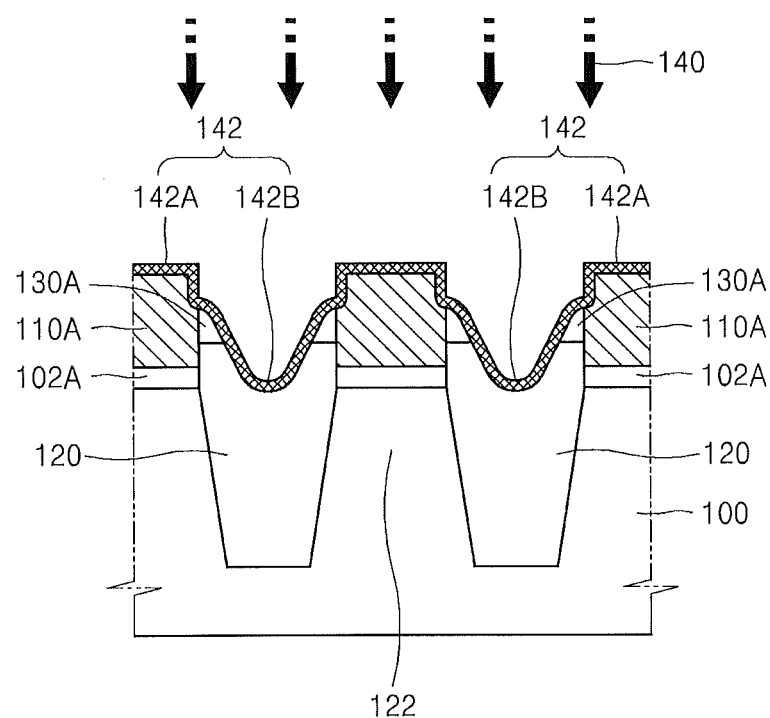

Referring to FIG. 3G, the exposed portions of the upper surface and sidewalls of the floating gate 110A and the exposed upper surfaces of the isolation layer 120 and the insulating spacer 130A are exposed to a nitridation atmosphere 140 so as to nitride the exposed surface of the floating gate 110A, the isolation layer 120 and the insulating spacer 130A to a predetermined depth, thereby forming a nitride layer 142.

The nitride layer 142 may include a first nitride layer portion 142A that is formed on the floating gate 110A and a second nitride layer portion 142B that is formed on the isolation layer 120 and the insulating spacers 130A. The nitride layer 142 may be formed to have a thickness in the range of about 50 to about 150 Angstroms.

The nitride layer 142 may be formed, for example, by plasma nitridation or thermal nitridation. When the nitride layer 142 is formed by plasma nitridation, remote plasma nitridation (RPN) or decoupled plasma nitridation (DPN) may be used. When RPN is used to form the nitride layer 142, the RPN may be performed under the nitridation atmosphere 140. The nitridation atmosphere 140 may be formed of a nitrogen plasma including a nitrogen radical (N*) by using a gas including nitrogen, such as $N_2$, $NH_3$, NO, or $N_2O$, and an inactive gas such as Ar or He, at a pressure lower than an ambient pressure and at an ambient temperature or at a temperature of up to about 800° C., for example, from about 400 to about 500° C. When DPN is used to form the nitride layer 142, $N_2$ gas may be applied to the substrate 100 at an ambient temperature and pressure.

When a thermal nitridation process is used to form the nitride layer 142, the nitridation atmosphere 140 may be formed by using a gas that includes nitrogen, such as, for example, $N_2$, $NH_3$, NO, or $N_2O$, at a temperature of from about 700° C. to about 800° C.

In the nitride layer 142, the first nitride layer portion 142A that is formed on the floating gate 110A may be a silicon nitride layer that is formed due to reaction between silicon atoms in the floating gate 110A and nitrogen atoms (N atoms) that are provided from the nitridation atmosphere 140. Accordingly, the nitrogen atoms that are included in the first nitride layer portion 142A may exist in a relatively stable bonding state. In contrast, in the second nitride layer portion 142B that is formed on the isolation layer 120 and the insulating spacer 130A, the nitrogen atoms may be unstably bonded to one another in the oxide layers that constitute the isolation layer 120 and the insulating spacer 130A, and thus the nitrogen atoms included in the second nitride layer portion 142B may exist in an unstable bonding state, compared to the nitrogen atoms included in the first nitride layer portion 142A.

The first nitride layer portion 142A that is formed on the floating gate 110A may increase the thickness of the equivalent oxide layer of an inter-gate dielectric layer that is formed in a subsequent process, suppress leakage current, and/or improve a cell distribution characteristic, thereby providing a transistor having improved electrical characteristics. The second nitride layer portion 142B that is formed on both the isolation layer 120 and the insulating spacer 130A provides a path for charge loss to an adjacent cell and also provides a path for a leakage current from the active region 122. Thus, as the concentration of nitrogen atoms that are included in the second nitride layer portion 142B increases, the charge trap characteristic of the cell deteriorates. In addition, as the number of trap sites increases, a stress induced leakage current (SILC) characteristic of the isolation layer 120 may deteriorate, thereby reducing the reliability of the flash memory device. Therefore, the first nitride layer portion 142A that is formed on the floating gate 110A may be left in place while the second nitride layer portion 142B that is formed on the isolation layer 120 and the insulating spacer 130A is selectively removed, or alternatively nitrogen atoms may be selectively removed from the second nitride layer portion 142B.

Figure 3H:
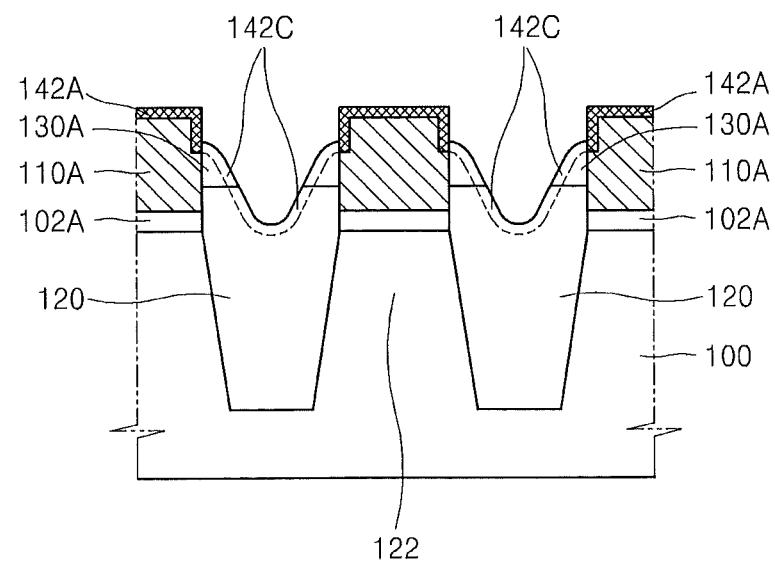

FIG. 3H illustrates the device after the nitrogen atoms have been selectively removed from the second nitride layer portion 142B of the nitride layer 142, so that the first nitride layer portion 142A remains only on the floating gate 110A.

In FIG. 3H, a remaining portion 142C of the second nitride layer 142B is illustrated by a dashed line, and represents the second nitride layer 142B after the nitrogen atoms are removed therefrom. After the nitrogen atoms are removed from the second nitride layer portion 142B, the remaining portion 142C may comprise a membrane that is the same as, or similar to, the isolation layer 120 and the insulating spacer 130A. It will also be appreciated that other methods may be used. Additionally, it will be appreciated that references to "selectively removing nitrogen atoms from the second nitride layer" and similar statements are not meant to suggest that every single nitrogen atom is removed from the second nitride layer 142B and/or that no nitrogen atoms are removed from the first nitride layer 142A. Instead, these phrases refer to operations that remove a significantly larger number of nitrogen atoms from the second nitride layer 142B as compared to the first nitride layer 142A such that the concentration of nitrogen atoms that remain in the first nitride layer 142A is significantly larger than the concentration of nitrogen atoms that remain in second nitride layer 142B.

Figure 4:
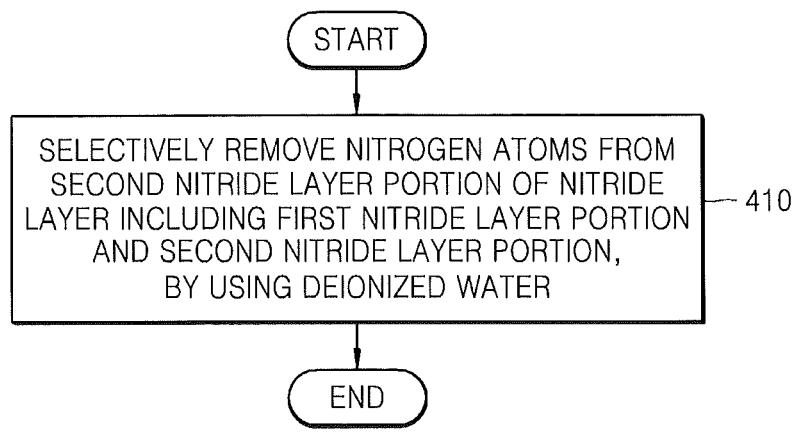
FIG. 4 is a flowchart of a method of performing a wet process in order to selectively remove nitrogen atoms from a second nitride layer portion of a nitride layer according to an embodiment of the inventive concept.
Figure 5:
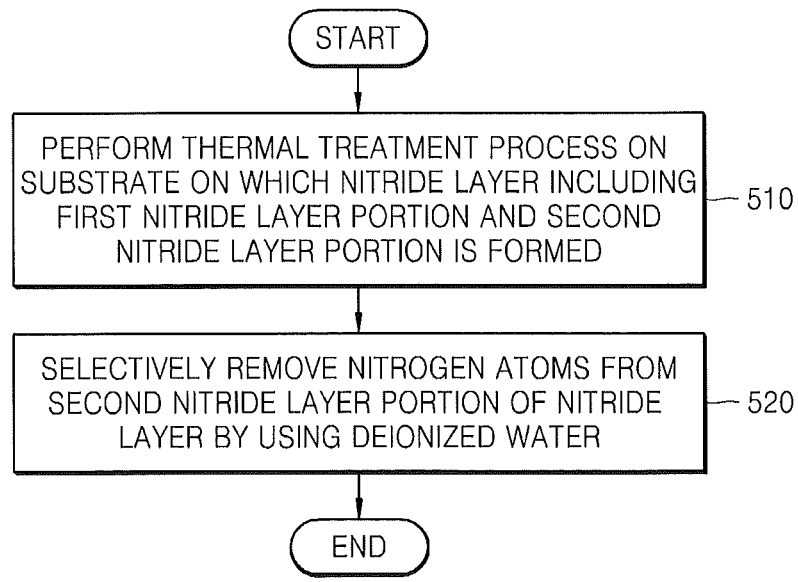
FIG. 5 is a flowchart of a method of sequentially performing a thermal treatment process and a wet process in order to selectively remove nitrogen atoms from a second nitride layer portion of a nitride layer according to further embodiments of the inventive concept.
Figure 6:
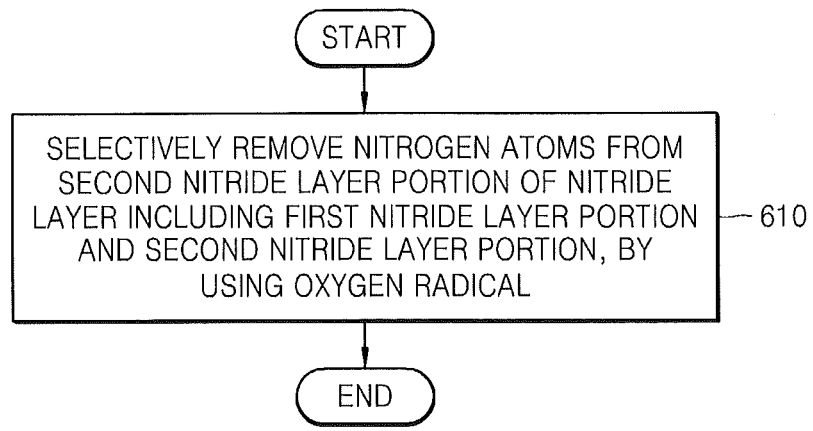
FIG. 6 is a flowchart of a method of performing a dry process in order to selectively remove nitrogen atoms from a second nitride layer portion of a nitride layer according to still further embodiments of the inventive concept.

The nitrogen atoms may be selectively removed only from the second nitride layer portion 142B by using, for example, any one of the methods that are described herein with reference to the flowcharts of FIGS. 4 through 6.

FIG. 4 is a flowchart of a method of performing a wet process in order to selectively remove the nitrogen atoms from the second nitride layer portion 142B of the nitride layer 142 according to an embodiment of the inventive concept.

Referring to FIG. 4, the nitrogen atoms are selectively removed from the second nitride layer portion 142B by using deionized water (Operation 410).

The nitrogen atoms may be selectively removed from the second nitride layer portion 142B by, for example, dipping the substrate 100 on which the insulating layer 142 is formed into deionized water. The deionized water may be maintained at a temperature of from about 20° C. to about 100° C. In particular, when the deionized water is maintained at a temperature of from about 40° C. to about 100° C., a variation in the concentration of the nitrogen atoms may be reduced or minimized, and the effect of selectively removing the nitrogen atoms only from the second nitride layer portion 142B may be enhanced.

As described above with reference to FIG. 3G, the nitrogen atoms included in the first nitride layer portion 142A that is formed on the floating gate 110A exist in a relatively stable bonding state. On the other hand, the nitrogen atoms that are included in the second nitride layer portion 142B exist in an unstable bonding state. Accordingly, when the insulating layer 142 is exposed to deionized water, the nitrogen atoms existing in a relatively stable bonding state in the first nitride layer portion 142A tend to remain, for the most part, stably bonded to the silicon atoms. On the other hand, the nitrogen atoms existing in a relatively unstable bonding state in the second nitride layer portion 142B may be easily separated from the second nitride layer portion 142B due to oxygen atoms provided in the deionized water. Thus, it is possible to selectively remove the nitrogen atoms from the second nitride layer portion 142B.

In Operation 410 of FIG. 4, the nitrogen atoms may be selectively removed from the second nitride layer portion 142B using only the deionized water. Alternatively, the nitrogen atoms may be selectively removed from the second nitride layer portion 142B by using a mixed solution of any one selected from the group consisting of ammonia ($NH_4OH$) and peroxide ($H_2O_2$) or a combination of the foregoing, along with the deionized water. It will also be appreciated that other oxygen containing solutions may be used to selectively remove the nitrogen atoms from the second nitride layer portion 142B.

FIG. 5 is a flowchart of a method of sequentially performing a thermal treatment process and a wet process in order to selectively remove the nitrogen atoms from the second nitride layer portion 142B of the nitride layer 142 according to another embodiment of the inventive concept.

Referring to FIG. 5, a thermal treatment process is performed on the substrate 100 on which the nitride layer 142 including the first nitride layer portion 142A and the second nitride layer portion 142B is formed (Operation 510).

The thermal treatment process may be performed at a temperature of from about 150° C. to about 600° C. for from about 10 seconds to about 1 hour. The thermal treatment may be performed, for example, under an atmosphere of any one selected from the group consisting of an inactive gas such as Ar or He, an $O_2$ gas, an $H_2$ gas, and an $N_2$ gas, or a combination of the foregoing.

The thermal treatment process may increase the stability of the Si—N bonds in the first nitride layer portion 142A, and thus may reduce or minimize the number of nitrogen atoms that are lost from the first nitride layer portion 142A during the subsequent process in which the substrate including the layer 142 is processed in deionized water. This thermal treatment does not significantly effect the bonding state of the nitrogen atoms in the second nitride layer portion 142B.

As shown in FIG. 5, after the thermal treatment process is completed, the nitrogen atoms may be selectively removed from the second nitride layer portion 142B of the nitride layer 142 using deionized water (Operation 520).

The deionized water treatment process described in Operation 520 may be the same as the corresponding operation in Operation 410 of FIG. 4, and thus a detailed description thereof will be omitted here.

FIG. 6 is a flowchart of a method of performing a dry process in order to selectively remove the nitrogen atoms from the second nitride layer portion 142B of the nitride layer 142 according to still further embodiments of the inventive concept.

Referring to FIG. 6, the nitrogen atoms are selectively removed from the second nitride layer portion 142B of the nitride layer 142 by using an oxygen radical (Operation 610).

In order to selectively remove the nitrogen atoms from the second nitride layer portion 142B by using the oxygen radical, $H_2$ and $O_2$ may be applied to a reaction chamber into which the substrate 100, on which the insulating layer 142 is formed, is loaded at a temperature of from about 800° C. to about 900° C. and at a pressure of from about 5 to about 100 Torr. As a result, the oxygen radical is generated in the reaction chamber by heat.

As described above with reference to FIG. 3G, the nitrogen atoms exist in a relatively stable bonding state in the first nitride layer portion 142A that is formed on the floating gate 110A. On the other hand, the nitrogen atoms exist in a relatively unstable bonding state in the second nitride layer portion 142B, as compared to the nitrogen atoms included in the first nitride layer portion 142A. Thus, when the insulating layer 142 is exposed to the oxygen radical, the nitrogen atoms that exist in the relatively stable bonding state in the first nitride layer portion 142A tend to remain, for the most part, stably bonded to the silicon atoms. On the other hand, the nitrogen atoms that exist in the relatively unstable bonding state in the second nitride layer portion 142B may be more easily separated from the second nitride layer portion 142B due to the oxygen radical. Thus, the nitrogen atoms may be selectively removed from the second nitride layer portion 142B.

As discussed above, the nitrogen atoms may be selectively removed from the second nitride layer portion 142B by using any one of the methods described with reference to FIGS. 4 through 6, and thus the remaining portion 142C from which the nitrogen atoms are removed remains on both the exposed surfaces of the isolation layer 120 and the insulating spacer 130A, as illustrated in FIG. 3H. The remaining portion 142C may comprise a membrane that is the same as, or similar to, the isolation layer 120 and the insulating spacer 130A. Thus, the first nitride layer portion 142A of the nitride layer 142 remains only on the exposed surfaces of the floating gate 110A.

Figure 3I:
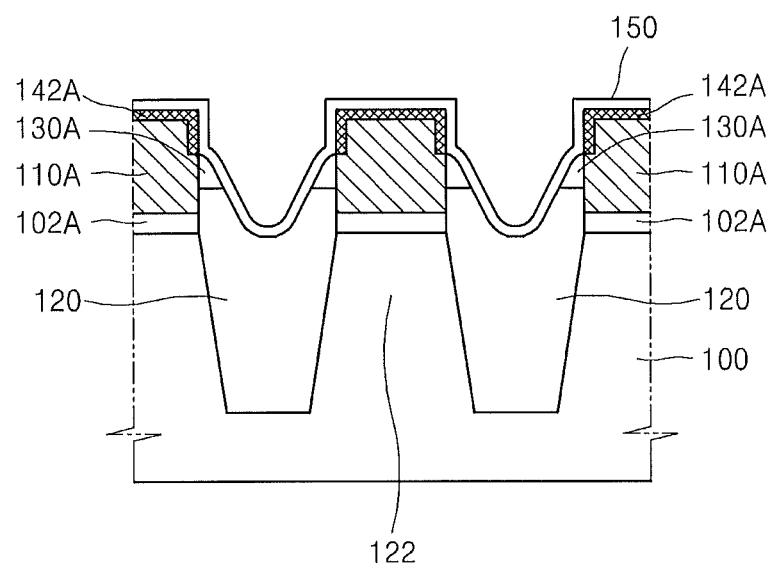

Referring to FIG. 3I, an inter-gate dielectric layer 150 is formed on the floating gate 110A, on which the first nitride layer portion 142A is formed, the isolation layer 120, and the insulating spacer 130A.

The inter-gate dielectric layer 150 may be an oxide-nitride-oxide (ONO) layer having a triple-layer structure in which a silicon oxide layer, a silicon nitride layer, and a silicon oxide layer are sequentially stacked. Alternatively, the inter-gate dielectric layer 150 may include a high dielectric layer material such as a metal oxide layer. The high dielectric layer material may be, for example, any one selected from the group consisting of an aluminum oxide layer, a yttrium oxide layer, a hafnium oxide layer, a tantalum oxide layer, a zirconium oxide layer, and a titanium oxide layer, or a combination of the foregoing. A material including nitrogen or silicon may also be added to the high dielectric layer.

Figure 3J:
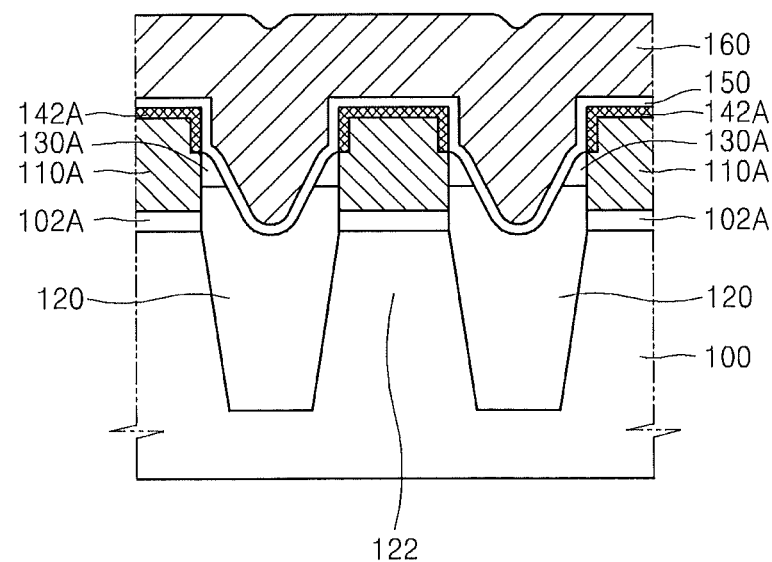

Referring to FIG. 3J, a control gate electrode layer 160 is formed on the inter-gate dielectric layer 150.

The control gate electrode layer 160 may be formed of any one selected from the group consisting of a doped polysilicon, a metal, a metal nitride layer, a metal silicide, and a metal compound, or a combination of the foregoing.

Then, the control gate electrode layer 160 is patterned by photolithography, so that a plurality of control gates each having a layout such as the plurality of word lines WL of FIG. 2 are formed. This patterning process exposes portions of the inter-gate dielectric layer 150. Then, a dry etching process is performed thereon, so that the exposed portions of the inter-gate dielectric layer 150 and the floating gate 110A (which is formed below the inter-gate dielectric layer 150) are patterned to form a plurality of memory cells.

In the plurality of memory cells formed through the above process, the first nitride layer portion 142A of the nitride layer 142 remaining on the floating gate 110A, while the nitrogen atoms are selectively removed from the second nitride layer portion 142B that is formed on the isolation layer 120 and the insulating spacer 130A between the floating gates 110A. The first nitride layer portion 142A may suppress a leakage current and improve a cell distribution characteristic in a cell transistor, thereby improving the reliability of the flash memory device. The second nitride layer portions 142B that are formed on the isolation layer 120 and the insulating spacer 130A are removed, and thus the nitride layer does not exist between the cell transistors. Therefore, charge loss resulting from charges moving from a first cell transistor to an adjacent cell transistor may be reduced, and a leakage current path from the active region 122 may be blocked, thereby better maintaining the reliability of the flash memory device.

Figure 7:
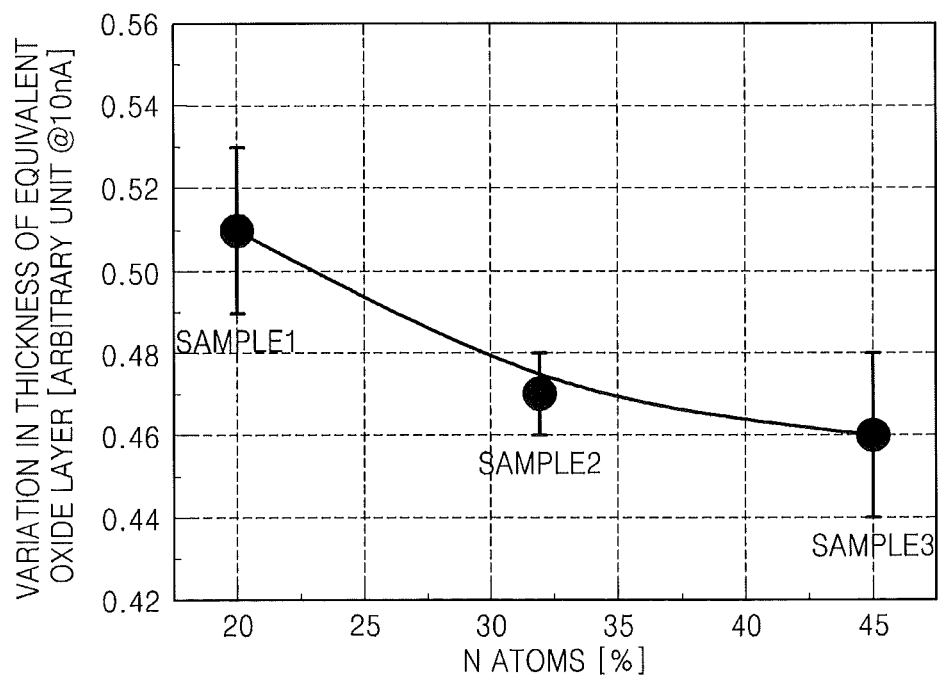
FIG. 7 is a graph illustrating variation in a thickness of an equivalent oxide layer of a inter-gate dielectric layer according to a nitrogen concentration in a first nitride layer portion of a nitride layer that is formed on a floating gate in a flash memory device in order to evaluate a punch through characteristic of a cell transistor according to the nitrogen concentration in the first nitride layer portion of a nitride layer according to embodiments of the inventive concept.

FIG. 7 is a graph illustrating the variation in a thickness of an equivalent oxide layer of the inter-gate dielectric layer 150 according to the nitrogen concentration in the first nitride layer portion 142A, in order to evaluate a punch through characteristic of the cell transistor according to the nitrogen concentration in the first nitride layer portion 142A of the nitride layer 142 that is formed on the floating gate 110A in the flash memory device.

Figure 8:
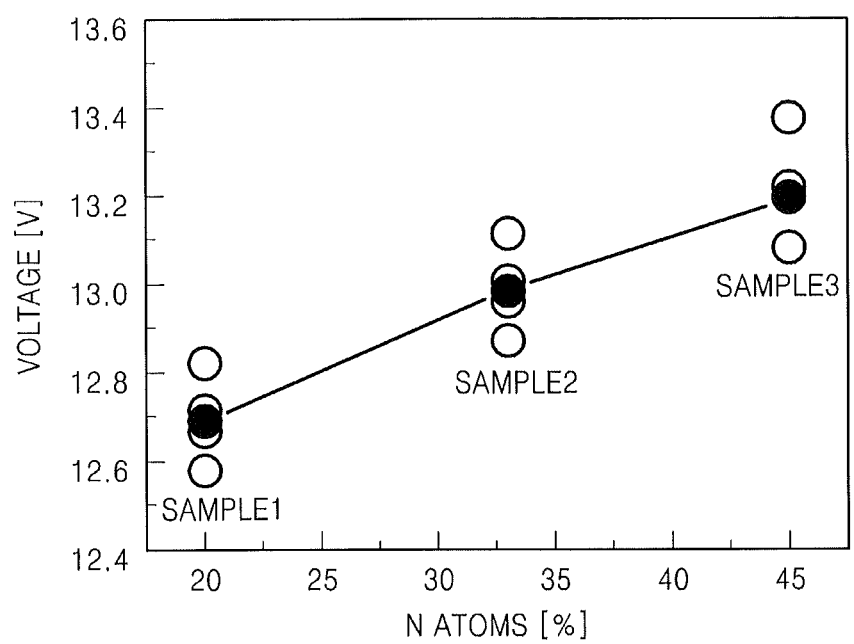
FIG. 8 is a graph illustrating a breakdown voltage of the cell transistor according to the nitrogen concentration in, the first nitride layer portion of the nitride layer formed on the floating gate in the flash memory device according to embodiments of the inventive concept.

FIG. 8 is a graph illustrating a breakdown voltage of the cell transistor according to the nitrogen concentration in the first nitride layer portion 142A of the nitride layer 142 that is formed on the floating gate 110A in the flash memory device.

For evaluation of FIGS. 7 and 8, the inter-gate dielectric layer 150 comprises an ONO layer that is formed on the first nitride layer portion 142A.

As shown in FIGS. 7 and 8, the variation in thickness of the equivalent oxide layer (and hence the punch through characteristic) as well as the breakdown voltage characteristic in the cell transistor are improved as the nitrogen concentration in the first nitride layer portion 142A increases.

Figure 9:
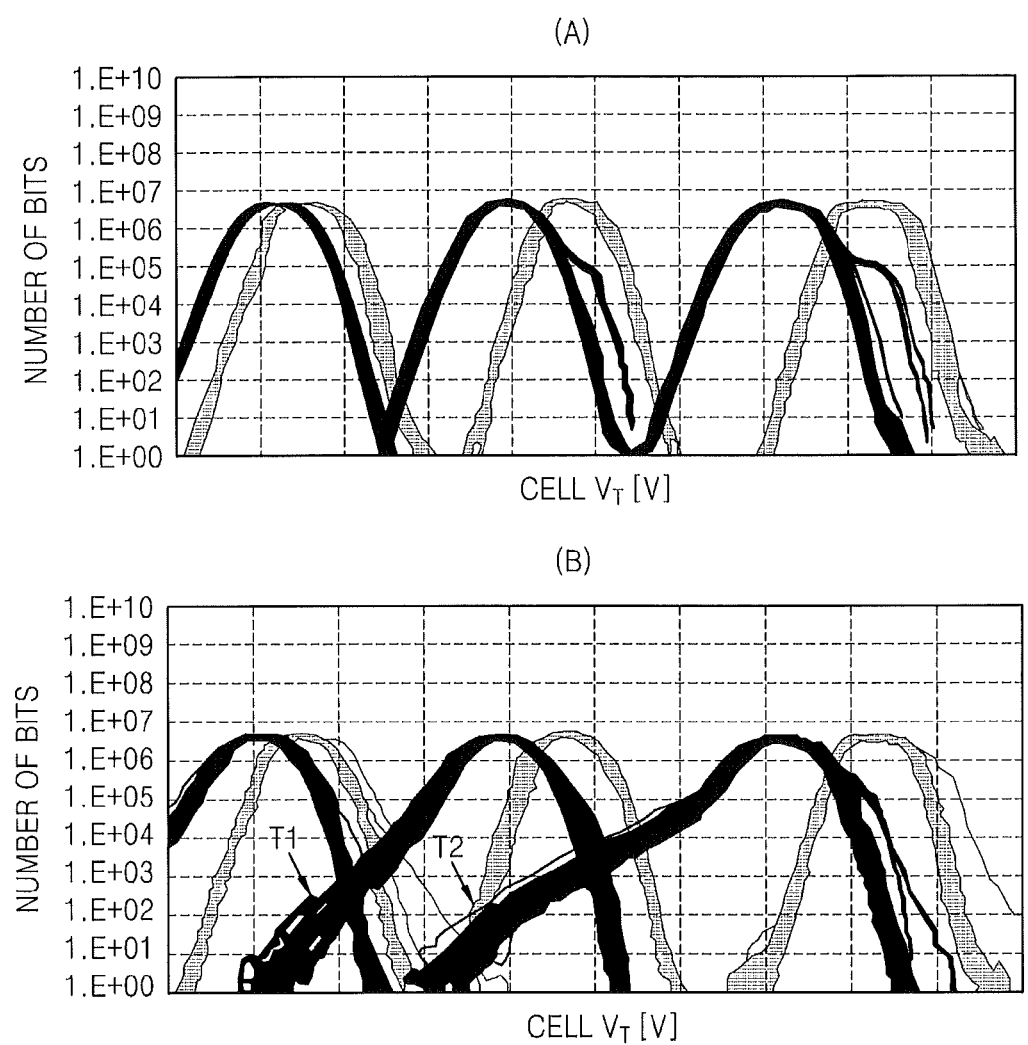
FIG. 9 shows two graphs (A) and (B) respectively illustrating distributions of threshold voltages $V_T$ of memory cells during programming/erasing operations in flash memory devices according to comparative examples of the inventive concept.

FIG. 9 shows two graphs (A) and (B) each illustrating a distribution of a threshold voltage $V_T$ of memory cells during programming/erasing operations in a flash memory device according to comparative examples.

The graphs of FIG. 9 illustrate the threshold voltage distribution of memory cells that were manufactured according to the process of FIGS. 3A-3J, except that the process for selectively removing the nitrogen atoms from the second nitride layer portion 142B that is described with reference to FIG. 3G was omitted, and thus the resulting flash memory devices included the second nitride layer portion 142B.

In FIG. 9, graph (A) shows a first comparative example, in which the concentrations of nitrogen atoms included in the first nitride layer portion 142A and the second nitride layer portion 142B are the same as the concentration of nitrogen atoms included in the first nitride layer portion 142A of the memory device of SAMPLE 1 that is illustrated in the graphs of FIGS. 7 and 8. Graph (B) of FIG. 9 shows a second comparative example, in which the concentrations of nitrogen atoms included in the first nitride layer portion 142A and the second nitride layer portion 142B are the same as the concentration of nitrogen atoms included in the first nitride layer portion 142A of the memory device of SAMPLE 3 that is illustrated in the graphs of FIGS. 7 and 8.

In graph (B) of FIG. 9, as the concentration of the nitrogen atoms in the nitride layer 142 increases, the threshold voltage $V_T$ of the memory cell decreases, and thus tail bits are generated as illustrated by T1 and T2.

Figure 10:
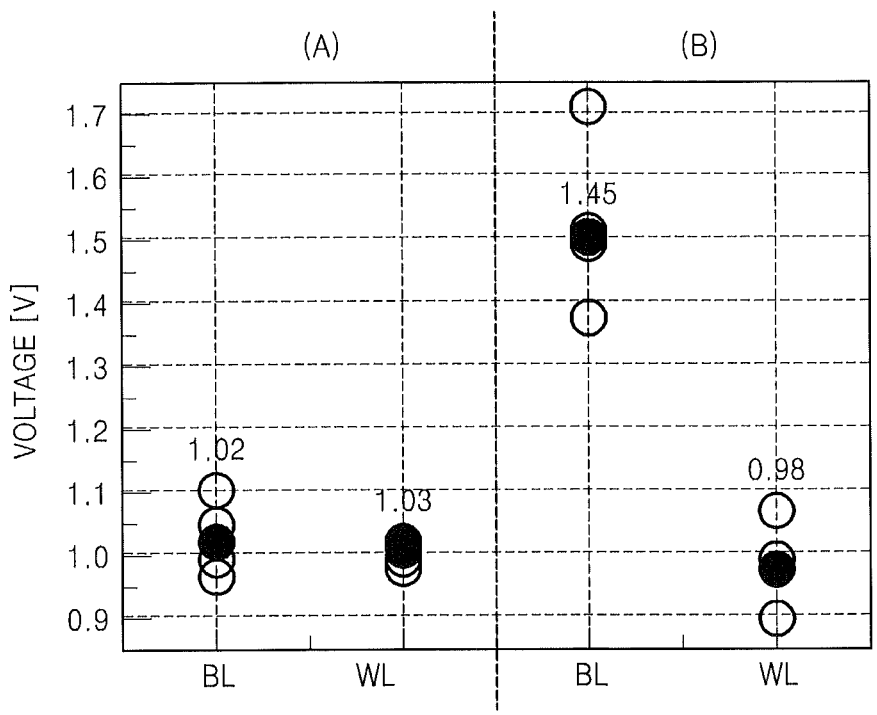
FIG. 10 is a graph illustrating charge losses in a word line (WL) direction and a bit line (BL) direction of flash memory devices according to comparative examples of the inventive concept.

FIG. 10 is a graph illustrating charge losses in a word line (WL) direction and a bit line (BL) direction of the flash memory devices that are discussed above with respect to the graph of FIG. 9, in order to show the reason for the generation of the tail bits in the memory cell that is illustrated in graph (B) of FIG. 9. In particular, the graph of FIG. 10 was generated by measuring the electrical characteristics in the word line WL and the bit line BL after the flash memory devices of the graphs (A) and (B) of FIG. 9 had undergone 1000 programming cycles in a high temperature storage environment.

As shown in FIG. 10, as the concentration of nitrogen atoms increases, the charge loss in the bit line BL direction increases. Thus, FIG. 10 demonstrates that if a second nitride layer portion 142B is allowed to remain on the isolation layer 120 and the insulating spacer 130A in the flash memory device, it may function as a path for charge loss.

Figure 11:
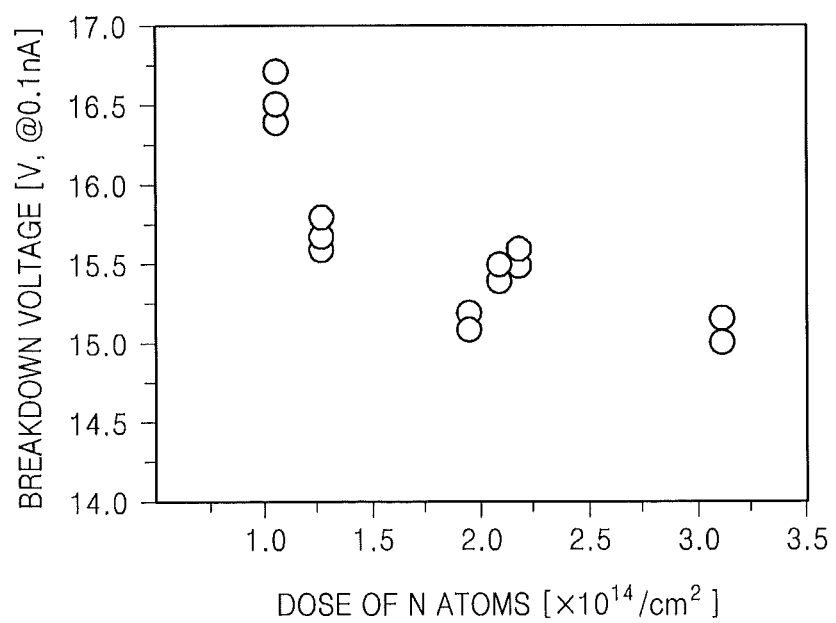
FIG. 11 is a graph illustrating a breakdown voltage in an isolation layer according to a variation in the amount of dose of nitrogen atoms in second nitride layer portions of a nitride layer that was formed on the isolation layer and an insulating spacer with respect to the flash memory devices according to the comparative examples.

FIG. 11 is a graph illustrating a breakdown voltage in the isolation layer 120 according to variation in the amount of dose of nitrogen atoms in the second nitride layer portion 142B that is formed on the isolation layer 120 and the insulating spacer 130A, with respect to the flash memory devices according to the comparative examples. The graph of FIG. 11 was generated by forming flash memory cells that included a TOSZ isolation layer, and then measuring the breakdown voltage between an active region and a control gate of the memory cells according to the variation in the dose of nitrogen atoms included in the TOSZ layer.

As shown in the graph of FIG. 11, as the dose of nitrogen atoms included in the TOSZ layer increases, the breakdown voltage decreases.

Figure 12:
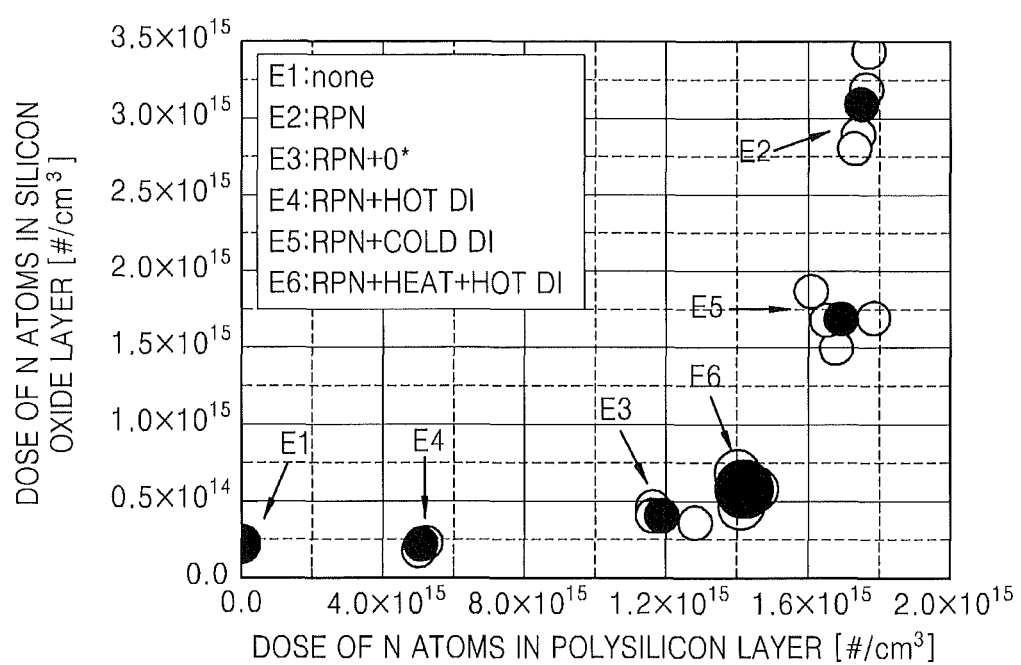
FIG. 12 is a graph illustrating an effect of selectively removing nitrogen atoms from the second nitride layer portion of the nitride layer when manufacturing a flash memory device by various methods.

FIG. 12 is a graph illustrating an effect of selectively removing the nitrogen atoms from the second nitride layer portion 142B of nitride layer 142 when manufacturing flash memory devices by various methods according to embodiments of the inventive concept.

For evaluation of FIG. 12, the nitride layer 142 described with reference to FIG. 3G is formed by forming a floating gate, which is formed of a polysilicon layer doped with an N+-type impurity, and an isolation layer and an insulating spacer that are formed of a silicon oxide layer, and then performing an RPN process on exposed surfaces of the floating gate, the isolation layer, and the insulating spacer. As such, the effect of selectively removing the nitrogen atoms included in the silicon oxide isolation layer and insulating spacer is evaluated by performing various processes on the polysilicon layer and the silicon oxide layers on which the nitride layer is formed.

In FIG. 12, E1 denotes a third comparative example in which the nitride layer is not formed on either the polysilicon layer or the silicon oxide layer. E2 denotes a fourth comparative example in which the nitride layer is formed on the polysilicon layer and the silicon oxide layer, but no subsequent processes are performed. E3 denotes a case in which the nitride layer is formed on the polysilicon layer and the silicon oxide layer and then the nitrogen atoms are selectively removed from the silicon oxide layer according to a dry process using an oxygen radical as described above with reference to FIG. 6. E4 denotes a case in which the nitride layer is formed on the polysilicon layer and the silicon oxide layer and then the nitrogen atoms are selectively removed from the silicon oxide layer according to a wet process using deionized water as described above with reference to FIG. 4, with the deionized water maintained at a temperature of about 70° C. E5 denotes a case in which the nitride layer is formed on the polysilicon layer and the silicon oxide layer and then the nitrogen atoms are selectively removed from the silicon oxide layer via a wet process using deionized water as described above with reference to FIG. 4, with the deionized water maintained at a temperature of about 20° C. E6 denotes a case where the nitride layer is formed on the polysilicon layer and the silicon oxide layer and then the nitrogen atoms are selectively removed from the silicon oxide layer by performing a thermal treatment on the nitride layer and then performing a wet process using deionized water as described above with reference to FIG. 5, with the deionized water maintained at a temperature of about 70° C.

As shown in the graph of FIG. 12, the variation in the nitrogen concentration in the nitride layer formed on the polysilicon layer may be reduced or minimized, and the nitrogen atoms may also be selectively removed from the portion of the nitride layer that is formed on the silicon oxide layers.

Figure 13:
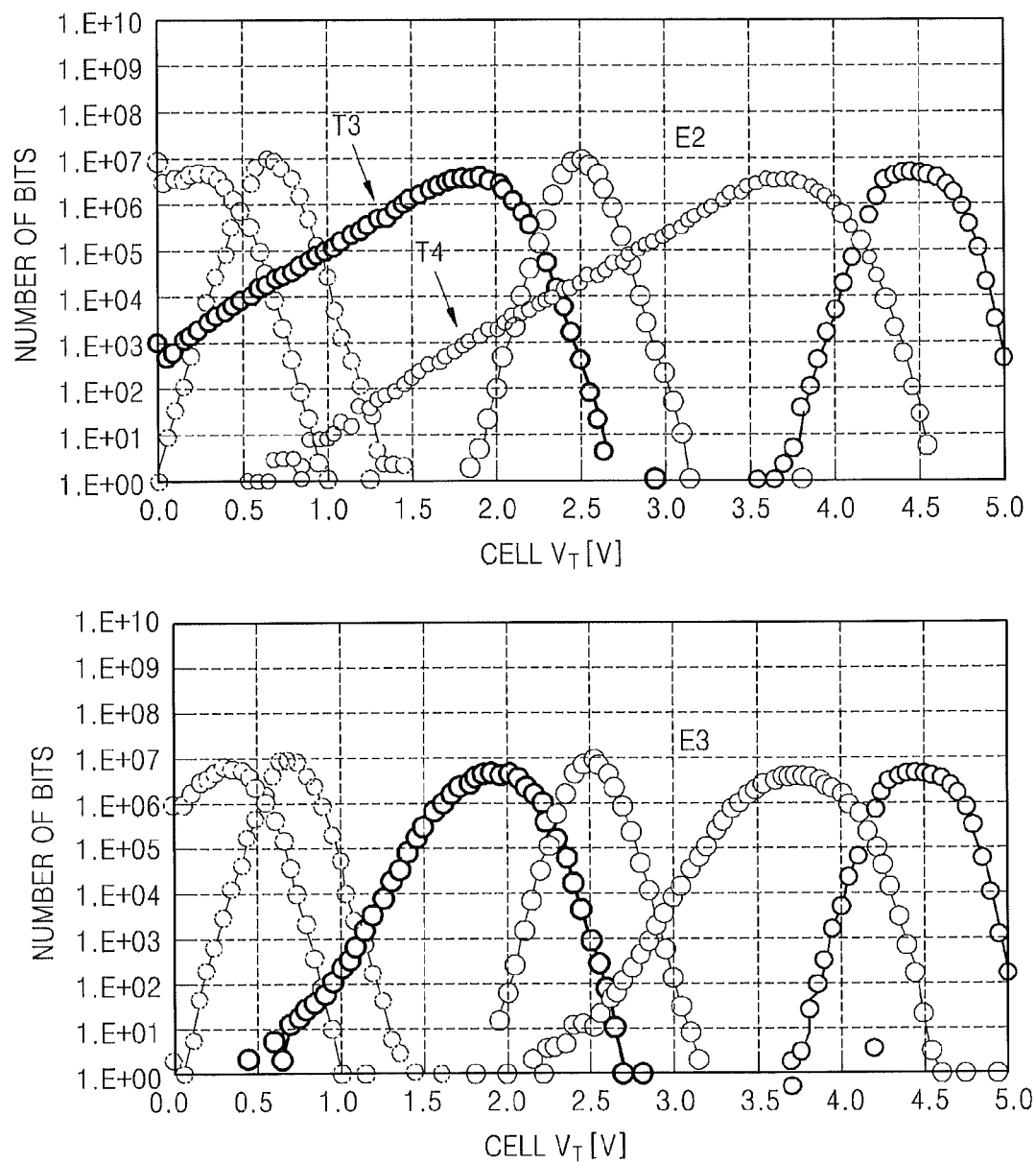
FIG. 13 is two graphs illustrating distributions of threshold voltages $V_T$ of memory cells during programming/erasing operations in flash memory devices according to a comparative example (E2) and an embodiment (E3) of the inventive concept.

FIG. 13 is a graph illustrating distributions of threshold voltages $V_T$ of memory cells during programming/erasing operations in the flash memory devices obtained from E2 and E3 of FIG. 12.

In E2 of FIG. 13, the nitrogen atoms remain without being removed from the nitride layer that is formed on the silicon oxide isolation layer and insulating spacer, and thus tail bits are generated as illustrated by T3 and T4 in FIG. 13. It is believed that the tail bits are formed because the nitride layer that is formed on the silicon oxide isolation layer and insulating spacer functions as a path for charge loss.

Figure 14:
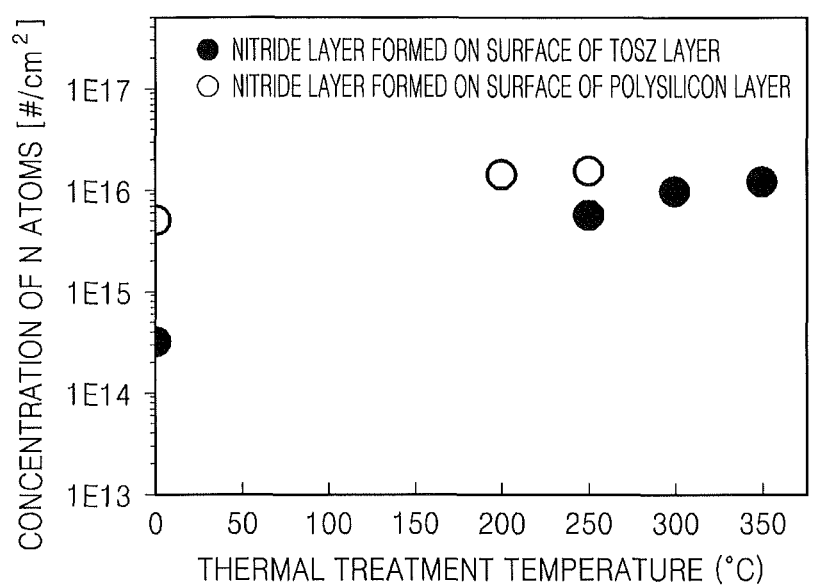
FIG. 14 is a graph illustrating a nitrogen concentration in various nitride layers formed according to embodiments of the inventive concept.

FIG. 14 is a graph illustrating a nitrogen concentration in each nitride layer according to a thermal treatment temperature, when a thermal treatment process is performed and then a wet process using deionized water is performed, in order to selectively remove nitrogen atoms from the portion of the nitride layer that is formed on the isolation layer and insulating spacer.

The graph of FIG. 14 was generated by performing the method described above with respect to example E6 of FIG. 12 in which a thermal treatment process is performed on the nitride layer at various temperatures, and then the nitrogen atoms are selectively removed from the silicon oxide layer according to a wet process using deionized water maintained at a temperature of about 70° C.

As shown in FIG. 14, the thermal treatment process and the wet process are performed at various temperatures, and then the concentration of the nitrogen atoms included in the nitride layer on which the TOSZ layer is formed is further decreased, as compared to the nitride layer formed on the polysilicon layer.

Figure 15:
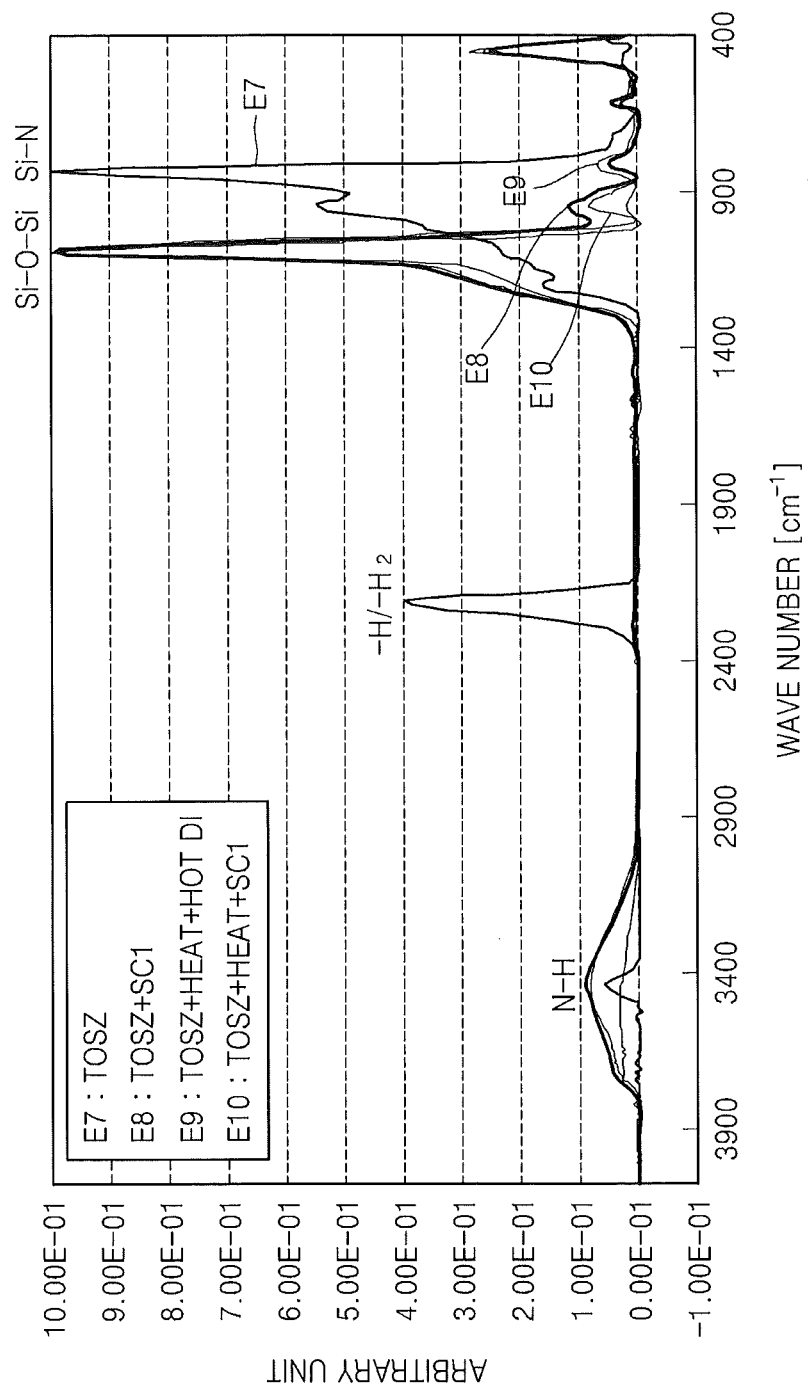
FIG. 15 is a graph illustrating an effect of removing nitrogen atoms from the second nitride layer portion formed on an oxide layer of a flash memory device by various methods according to embodiments of the inventive concept.

FIG. 15 is a graph illustrating an effect of removing nitrogen atoms from the second nitride layer portion 142B that is formed on an oxide layer of a flash memory device by various methods, according to embodiments of the inventive concept.

In the device evaluated in FIG. 15, the nitride layer 142 is formed by performing an RPN process on an exposed surface of the TOSZ layer, as described above with reference to FIG. 3G. As such, after various processes are performed on the TOSZ layer on which the nitride layer 142 is formed, components of the surface of the TOSZ layer are analyzed.

In FIG. 15, E7 denotes a fifth comparative example in which the nitride layer is formed on the TOSZ layer, and no subsequent processes are performed. E8 denotes a case in which the nitride layer is formed on the TOSZ layer, and then the nitrogen atoms are removed from the nitride layer formed on the TOSZ layer according to a wet process as described above with reference to FIG. 4. This wet process is performed using a mixed solution including ammonia, peroxide, and deionized water. The composition ratio of deionized water, ammonia, peroxide is 20:1:4, and a temperature of the mixed solution is maintained at about 20° C. E9 denotes a case where the nitride layer is formed on the TOSZ layer, a thermal treatment process is performed on the nitride layer as described above with reference to FIG. 5, and then the nitrogen atoms are removed from the nitride layer formed on the TOSZ layer using a wet process. The wet process is performed using deionized water maintained at a temperature of about 70° C. E10 denotes a case where the nitride layer is formed on the TOSZ layer, a thermal treatment process is performed on the nitride layer as described above with reference to FIG. 5, and then the nitrogen atoms are removed from the nitride layer formed on the TOSZ layer using a wet process. The wet process is performed using a mixed solution that is the same as that used in case E8.

As shown in FIG. 15, when various processes are performed on the nitride layer that is formed on the TOSZ layer according to various embodiments of the inventive concept, a Si—O—Si bonding peak, instead of a Si—N bonding, is generated on the surface of the TOSZ layer. Thus, when processes are performed on the nitride layer formed on the TOSZ layer according to various embodiments of the inventive concept, the nitrogen atoms are removed from the nitride layer formed on the TOSZ layer and thus the layer changes into a silicon oxide layer.

In methods of manufacturing flash memory devices according to embodiments of the inventive concept, a nitride layer is formed only on a floating gate, as nitrogen atoms are selectively removed from the nitride layer that is formed on the isolation layer and the insulating spacer. Thus, a leakage current in a cell transistor may be suppressed due to the nitride layer formed between the floating gate and an inter-gate dielectric layer and a cell distribution characteristic may be improved, thereby improving the reliability of the flash memory device. Furthermore, since the nitrogen atoms are removed from the nitride layer that is formed on the isolation layer and the insulating spacer, and thus the nitride layer does not exist between the cell transistors. Therefore, loss of charges moving from the cell transistor to an adjacent cell may be reduced, and a path for leakage currents from the active region may be blocked, thereby maintaining the reliability of the flash memory device. Thus, according to the inventive concept, an electrical reliability of the flash memory device and a data capability of a cell can be improved.

While the inventive concept has been particularly shown and described with reference to exemplary embodiments thereof, it will be understood that various changes in form and details may be made therein without departing from the spirit and scope of the following claims.

What is claimed is:

1. A method of manufacturing a flash memory device, the method comprising:
    forming a dielectric layer on an active region of a substrate;
    forming a floating gate on the dielectric layer;
    forming an isolation layer in an isolation region of the substrate;
    forming an insulative spacer layer directly on the floating gate and on the isolation region;
    performing an etch back process on the spacer layer to expose at least the floating gate;
    forming a nitride layer comprising a first nitride layer portion that is formed on an exposed surface of the floating gate and a second nitride layer portion that is formed on an exposed surface of the isolation layer and on an exposed surface of the spacer layer;
    selectively removing nitrogen atoms from the second nitride layer portion of the nitride layer by performing a thermal treatment process on the nitride layer and then exposing the nitride layer to a mixed solution of deionized water and at least one selected from the group consisting of ammonia and peroxide maintained at a temperature of from about 40° C. to about 100° C. in order to selectively remove the nitrogen atoms from the second nitride layer portion of the nitride layer;
    forming an inter-gate dielectric layer on both the first nitride layer portion and the isolation layer; and
    forming a control gate on the inter-gate dielectric layer.

2. The method of claim 1, wherein forming the nitride layer comprises substantially simultaneously exposing an exposed surface of the floating gate and an exposed surface of the isolation layer to a nitridation atmosphere.

3. The method of claim 1, wherein the floating gate comprises a doped polysilicon floating gate, and the isolation layer comprises an oxide isolation layer, and wherein selectively removing nitrogen atoms from the second nitride layer portion of the nitride layer comprises substantially removing the nitrogen atoms from the second nitride layer portion while selectively removing nitrogen atoms from the second nitride layer portion of the nitride layer while substantially leaving the nitrogen atoms in the first nitride layer portion.

4. The method of claim 1, wherein the thermal treatment process is performed at a temperature of from about 150° C. to about 600° C.

5. The method of claim 1, wherein the thermal treatment process is performed under an atmosphere of at least one selected from the group consisting of an inactive gas, an O2 gas, an H2 gas, and an N2 gas.

6. The method of claim 1, wherein selectively removing nitrogen atoms from the second nitride layer portion of the nitride layer comprises performing a dry process on the nitride layer in order to selectively remove the nitrogen atoms from the second nitride layer portion of the nitride layer.

7. The method of claim 6, wherein the dry process is performed using an oxygen radical.

8. The method of claim 7, wherein performing the dry process comprises applying H2 and O2 to the insulating layer at a temperature of from about 800° C. to about 900° C. and at a pressure of from about 5 to about 100 Torr.

9. A method of manufacturing a flash memory device, the method comprising:
    forming a dielectric layer on an active region of a substrate;
    forming a floating gate that includes a polysilicon on the dielectric layer;
    forming an isolation layer that includes an oxide in an isolation region of the substrate;
    forming a nitride layer comprising a first nitride layer portion that is formed on an exposed surface of the floating gate and a second nitride layer portion that is formed on an exposed surface of the isolation layer; and
    selectively removing nitrogen atoms from the second nitride layer portion of the nitride layer,
    wherein selectively removing nitrogen atoms from the second nitride layer portion of the nitride layer comprises exposing the nitride layer to a processing solution formed of a mixed solution of deionized water and at least one selected from the group consisting of ammonia and peroxide maintained at a temperature of from about 40° C. to about 100° C. in order to selectively remove the nitrogen atoms from the second nitride layer portion while leaving the first nitride layer portion on the exposed surface of the floating gate and stabilizing a Si—N bonding in the first nitride layer portion by performing a thermal treatment process on the nitride layer before exposing the nitride layer to the processing solution.

10. The method of claim 9, wherein the thermal treatment process is performed at a temperature of from about 150° C. to about 600° C.

11. The method of claim 9, wherein the thermal treatment process is performed under an atmosphere of at least one selected from the group consisting of an inactive gas, an O2 gas, an H2 gas, and an N2 gas.

* * * * *